(12) United States Patent
Tsai et al.

(10) Patent No.: US 8,749,931 B2
(45) Date of Patent: Jun. 10, 2014

(54) ELECTROSTATIC DISCHARGE PROTECTION APPARATUS

(75) Inventors: Fu-Yi Tsai, Hsinchu (TW); Chia-Ku Tsai, New Taipei (TW); Yan-Hua Peng, Hsinchu (TW); Ming-Dou Ker, Hsinchu County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 84 days.

(21) Appl. No.: 13/456,204

(22) Filed: Apr. 25, 2012

(65) Prior Publication Data

US 2013/0088801 A1    Apr. 11, 2013

(30) Foreign Application Priority Data

Oct. 5, 2011   (TW) .............................. 100136118 A

(51) Int. Cl.
*H02H 9/00*   (2006.01)
*H02H 1/00*   (2006.01)
*H02H 1/04*   (2006.01)
*H02H 3/22*   (2006.01)
*H02H 9/06*   (2006.01)

(52) U.S. Cl.
USPC ............................................ 361/56; 361/118

(58) Field of Classification Search
USPC ........................................................... 361/56
See application file for complete search history.

(56) References Cited

U.S. PATENT DOCUMENTS

| | | | |
|---|---|---|---|
| 5,530,612 A | 6/1996 | Maloney | |
| 6,411,485 B1 | 6/2002 | Chen et al. | |
| 6,580,184 B2 | 6/2003 | Song | |
| 6,768,616 B2 | 7/2004 | Mergens et al. | |
| 2007/0195472 A1* | 8/2007 | Kwak et al. ..................... | 361/56 |

* cited by examiner

*Primary Examiner* — Dharti Patel
(74) *Attorney, Agent, or Firm* — Winston Hsu; Scott Margo

(57) ABSTRACT

An electrostatic discharge (ESD) protection apparatus includes at least one first transistor and at least one second transistor. The first transistor includes a control terminal, a first terminal, a second terminal, and a bulk. The control terminal and the second terminal of the first transistor are coupled to each other. The first terminal of the first transistor is coupled to one of a pad and a power rail line. Likewise, the second transistor also includes a control terminal, a first terminal, and a second terminal. The first terminal of the second transistor is coupled to the bulk of the first transistor, the bulk of the second transistor is coupled to the second terminal of the first transistor, and the second terminal of the second transistor is coupled to the other of the pad and the power rail line.

12 Claims, 6 Drawing Sheets

ELECTROSTATIC DISCHARGE PROTECTION APPARATUS

CROSS-REFERENCE TO RELATED APPLICATION

This application claims the priority benefit of Taiwan application serial no. 100136118, filed on Oct. 5, 2011. The entirety of the above-mentioned patent application is hereby incorporated by reference herein and made a part of this specification.

BACKGROUND OF THE INVENTION

1. Field of the Invention

The present invention relates to an electrostatic discharge protection apparatus, and more particularly, to an electrostatic discharge protection apparatus which utilizes a parasitic silicon controlled rectifier (SCR) for electrostatic protection.

2. Description of Related Art

With the advancement in semiconductor fabrication process, the gate oxides of transistors in nowadays semiconductor fabrication process are becoming increasingly thinner and, as a result, can be more easily damaged in an electrostatic discharge (ESD) event. Therefore, it is desired to develop an ESD protection technique for the current semiconductor fabrication.

Existing ESD protection apparatus are often constructed by ESD protection elements that have thin gate oxides. The ESD protection elements having thin gate oxides produce a large leakage current during a normal operation of the circuit which the ESD protection elements belong to. On the contrary, the ESD protection apparatus is constructed by the ESD protection elements having thick gate oxides, it is hard to trigger the ESD protection apparatus can be hard, and such as that the protection effect is reduced.

In addition, silicon controlled rectifiers (SCRs) are conventionally used to construct the ESD protection apparatus. However, the conventional SCRs are hard to trigger (which requires a high triggering voltage). As a result, damage to elements (having thin gate oxides) of the circuit which the SCR belongs to often occurs before the SCR is triggered, thus making it unable to achieve the ESD protection function.

SUMMARY OF THE INVENTION

Accordingly, the present invention is directed to multiple types of ESD protection apparatus which can achieve the best ESD protection result by using the smallest layout area.

The present invention provides an ESD protection apparatus including at least one first transistor and at least one second transistor. The first transistor includes a control terminal, a first terminal, a second terminal, and a bulk. The control terminal and the second terminal of the first transistor are coupled to each other. The first terminal of the first transistor and a pad are coupled to each other. Likewise, the second transistor also includes a control terminal, a first terminal, and a second terminal. The first terminal of the second transistor is coupled to the bulk of the first transistor, the control terminal of the second transistor is coupled to the first terminal of the second transistor, the bulk of the second transistor is coupled to the second terminal of the first transistor, and the second terminal of the second transistor is coupled to a power rail line.

The present invention also provides an ESD protection apparatus including a first transistor and at least one second transistor. The first transistor includes a control terminal, a first terminal, a second terminal, and a bulk. The control terminal and the second terminal of the first transistor are commonly coupled one of a pad and a power rail line. The bulk and the first terminal of the first transistor are coupled to each other. The second transistor includes a control terminal, a first terminal, a second terminal, and a bulk. The control terminal and the second terminal are coupled to the bulk and the first terminal of the first transistor. The bulk and the first terminal of the second transistor are coupled to the other of the pad and the power rail line.

The present invention also provides an ESD protection apparatus including a first transistor and at least one second transistor. The first transistor includes a control terminal, a first terminal, a second terminal, and a bulk. The control terminal and the first terminal of the first transistor are commonly coupled to one of a pad and a power rail line. The second transistor includes a control terminal, a first terminal, a second terminal, and a bulk. The control terminal of the second transistor is coupled to the bulk of the first transistor and the first terminal of the second transistor. The bulk of the second transistor is coupled to the second terminal of the first transistor. The second terminal of the second transistor is coupled to the other of the pad and the power rail line.

The present invention also provides an ESD protection apparatus including a first transistor and at least one second transistor. The first transistor includes a control terminal, a first terminal, a second terminal, and a bulk. The first terminal and the second terminal of the first transistor are coupled to a pad and a power rail line respectively, and the control terminal of the first transistor being coupled to one of the pad and the power rail line. The second transistor includes a control terminal, a first terminal, a second terminal, and a bulk. The control terminal of the second transistor is coupled to the second terminal of the second transistor and to the bulk of the first transistor. The first terminal and the bulk of the second transistor are commonly coupled to the other of the pad and the power rail line.

In view of the foregoing, the present invention utilizes multiple series-connected transistors to form the ESD protection apparatus and utilizes different connections among the bulk, control terminal, first terminal and second terminal of each transistor to effectively reduce the triggering voltage of the parasitic silicon controlled rectifier (SCR), such that, upon an ESD occurrence, the SCR in the ESD protection apparatus can be immediately conducted to channel the big current produced due to the ESD event. This can reduce damage to the gate oxide due to the unduly slow conduction of the SCR in the ESD protection apparatus.

DESCRIPTION OF THE EMBODIMENTS

Figure 1A:
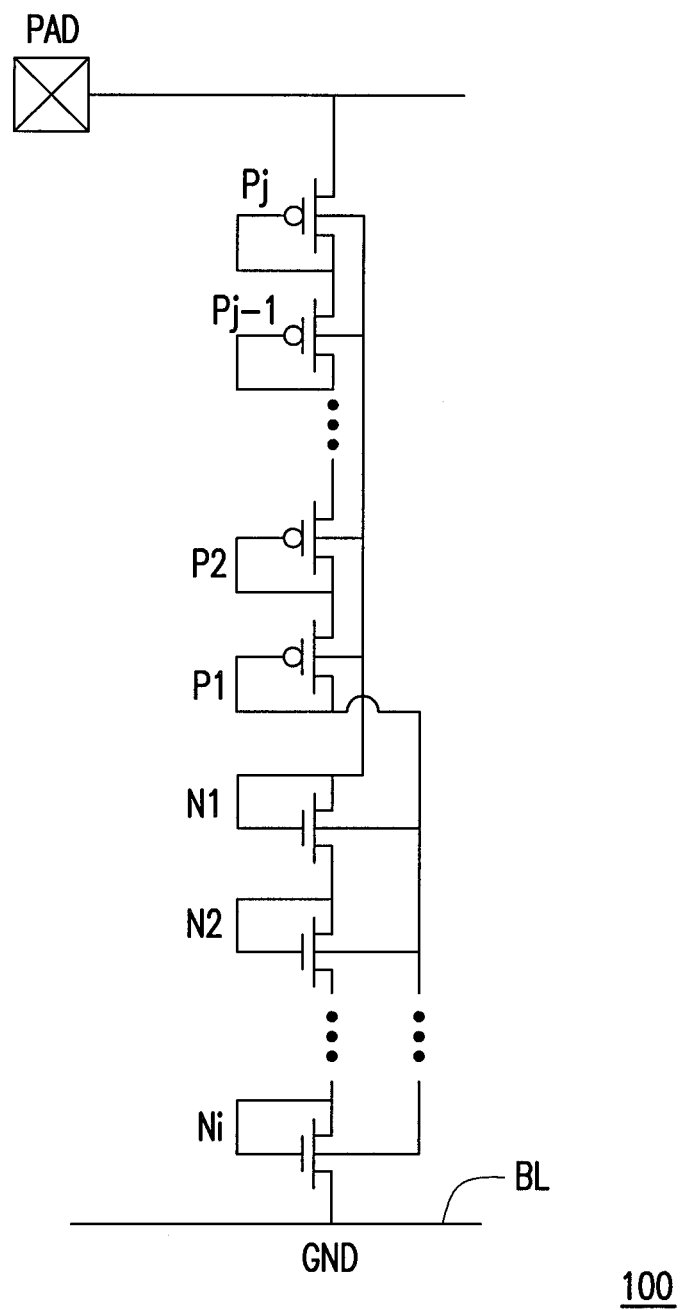
FIG. 1A illustrates an ESD protection apparatus according to one embodiment of the present invention.

FIG. 1A illustrates an electrostatic discharge (ESD) protection apparatus 100 according to one embodiment of the present invention. Referring to FIG. 1A, the ESD protection apparatus 100 includes transistors P1 to Pj and transistors N1 to Ni. A control terminal (gate) and a second terminal (drain) of the transistor Pj are coupled to each other, and a first terminal (source) of the transistor Pj is coupled to a pad PAD. A bulk of the transistor Pj is coupled to the transistor N1, and the drain of the transistor Pj is coupled to a next transistor Pj–1.

In addition, the transistors P1 to Pj–1 are connected in series between the transistor Pj and the transistor N1. Taking the transistor P2 as an example, a bulk of the transistor P1 is commonly coupled to bulks of the transistors P2 to Pj, a drain and a gate of the transistor P1 are coupled to each other, the drain of the transistor P1 is coupled to bulks of the transistors N1 to Ni, and a source of the transistor P1 is coupled to a gate and a drain of the transistor P2.

A second end (source) of the transistor Ni is coupled to a ground voltage GND supplied by a power rail line BL. Notably, the bulks of the transistors Ni to Ni are commonly coupled to the drain of the transistor P1.

In the present embodiment, when an ESD event occurs on the pad PAD and a resulted ESD current flows out of the pad PAD, the ESD current may discharge through the series-connected transistors P1 to Pj and flow to the power rail line BL through the bulks of the transistors N1 to Ni.

Alternatively, the ESD current may also flow from the drain of the transistor P1 to the bulks of the transistors P1 to Pj through a forward conduction of a parasitic diode, and flow to the power rail line BL through the series-connected transistors N1 to Nj, such that the ESD current can be effectively discharged.

Figure 1B:
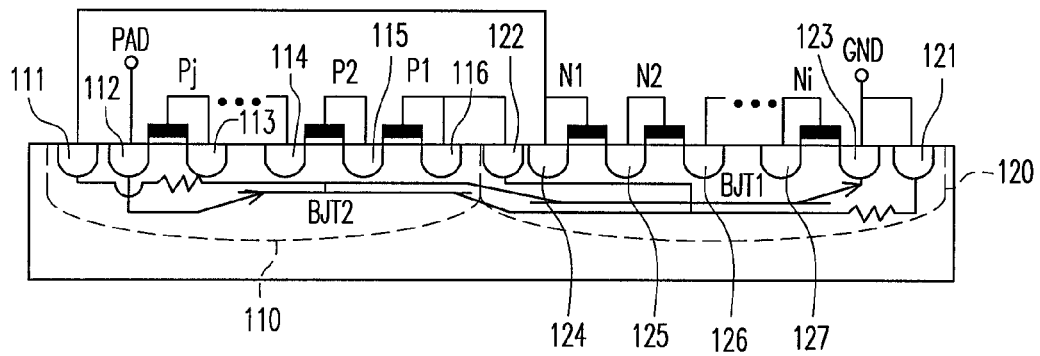
FIG. 1B is a cross sectional view of the structure of the ESD protection apparatus according to the embodiment of the present invention.

Referring also to FIG. 1B, FIG. 1B is a cross sectional view of the structure of the ESD protection apparatus 100 according to the embodiment of the present invention. The transistors P1 to Pj are constructed on an N-type well (N-well) 110, and the transistors N1 to Ni are constructed on a P-type well (P-well) 120. The N-well 110 is provided with multiple P-type heavily doped regions (P+) 112 to 116 serving as the sources and drains of the transistors P1 to Pj. In addition, the N-well 110 is provided with an N-type heavily doped region (N+) 111 serving as the common bulk of the transistors P1 to Pj. Further, the P-well 120 is provided with multiple N-type heavily doped regions (N+) 123 to 127 serving as the sources and drains of the transistors N1 to Ni. The P-well 120 is further provided with P-type heavily doped regions (P+) 121 and 122. The heavily doped region 121 serves as the common bulk of the transistors N1 to Ni, and the heavily doped region 122 serves as the bulk of the transistor N1 for connecting to the drain of the transistor P1 (constructed by the P-type heavily doped region 116).

Notably, in the present ESD protection apparatus 100, the N-type heavily doped region 111, N-well 110, P-well 120 and N-type doped region 123 form a parasitic transistor BJT1, while the P-type heavily doped region 112, N-well 110, P-well 120 and P-type heavily doped region 121 form a parasitic transistor BJT2. The transistor BJT1 and the transistor BJT2 are coupled to each other to form a silicon controlled rectifier (SCR). This SCR formed by the transistor BJT1 and the transistor BJT2 can be quickly triggered to provide a discharge path for the ESD current upon ESD occurrence on the pad PAD.

Referring again to FIG. 1A, in the present embodiment, the transistors N1 to Ni are N-type transistors, and the transistors P1 to Pj are P-type transistors. In addition, the number of the transistors N1 to Ni and the transistors P1 to Pj can be adjusted based on characteristics of the circuit which the ESD protection apparatus 100 belongs to and the threshold voltage of the transistors N1 to Ni and P1 to Pj. Specifically, under a normal operating state (i.e. a state in which the ESD protection apparatus is not triggered) of the circuit which the ESD protection apparatus 100 belongs to, the leakage current generated through the transistors N1 to Ni and P1 to Pj must be lower than a tolerated range at a highest possible voltage designed for the pad PAD. Therefore, the minimal possible number of the transistors N1 to Ni may be one, and the minimal possible number of the transistors P1 to Pj may also be one. The less the number of the transistors is, the less voltage drop the transistors cause when the ESD current is conducted. On the other hand, the more the number of the transistors is, the smaller leakage current the transistors generate under a normal operation. Therefore, the optimum transistor number may be determined based on circuit simulation results.

Figure 2A:
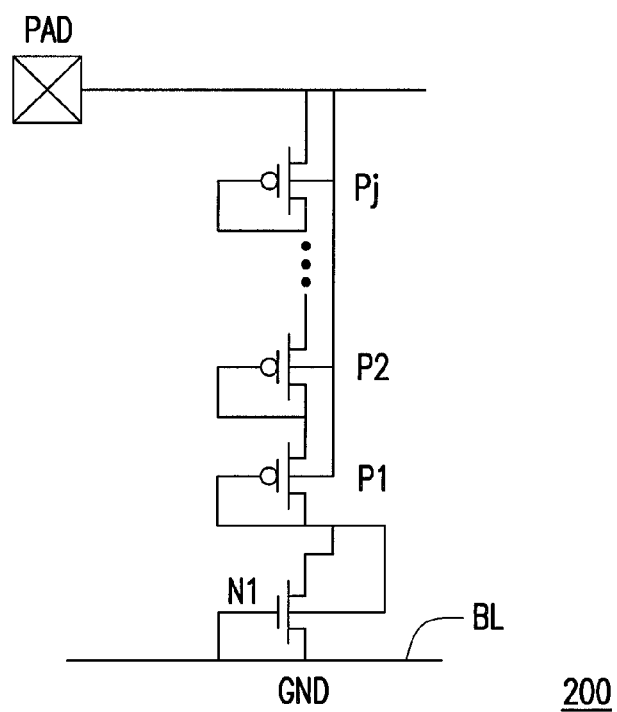
FIG. 2A and FIG. 2B illustrate different implementations of an ESD protection apparatus according to another embodiment of the present invention, respectively.
Figure 2B:
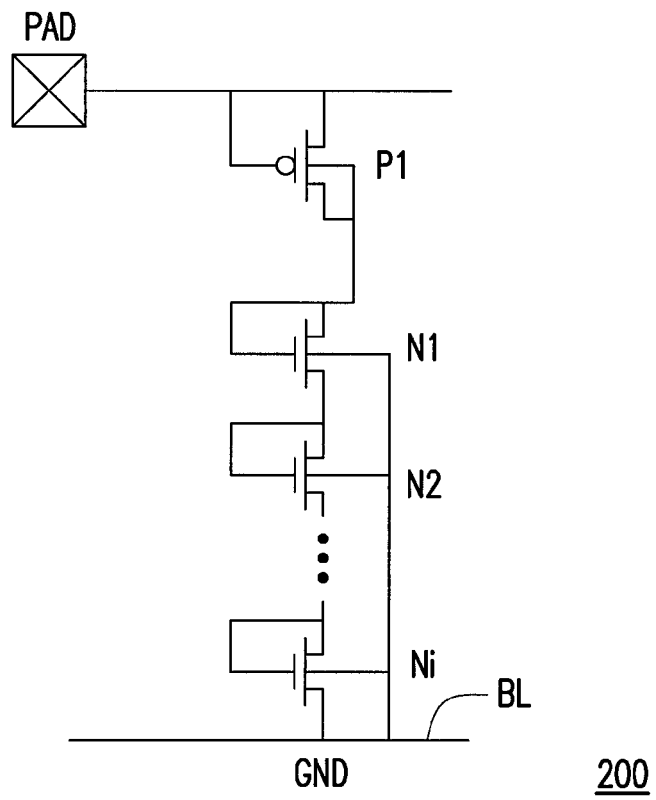

FIG. 2A and FIG. 2B illustrate different implementations of an ESD protection apparatus 200 according to another embodiment of the present invention, respectively. As shown in FIG. 2A, the ESD protection apparatus 200 includes a transistor N1 and transistor P1 to Pj. The transistor N1 has a control terminal (gate), a first terminal (drain), a second terminal (source), and a bulk. The gate and source of the transistor N1 are coupled to the power rail line BL. The bulk and drain of the transistor N1 are coupled to each other. The transistors P1 to Pj are connected in series between the pad PAD and the drain of the transistor N1, and the gate and drain of each transistor P1 to Pj are coupled to each other. In addition, the bulks of the transistors P1 to Pj are commonly coupled to the pad PAD. Further, the string of transistors P1 to Pj is coupled to the drain of the transistor N1 through the gate and drain of the transistor P1.

It should be noted that the power rail line BL provides a ground voltage GND. Upon an ESD occurrence on the pad PAD, an ESD current flowing out of the pad PAD flows to the bulk of the transistor N1 through the channel of the transistors P1 to Pj and thereby quickly triggers the parasitic SCR in the transistors P1 to Pj and transistor N1, thus effectively discharging the ESD current.

In the present embodiment, the number of the transistors P1 to Pj may be selected according to the actual circuit which the transistors belong to. In brief, the leakage current generated through the transistors N1 and P1 to Pj must be lower than a tolerated range at a highest possible voltage designed for the pad PAD. The minimal possible number of the transistors P1 to Pj may be one. The less the number of the transistors is, the less voltage drop the transistors cause. On the other hand, the more the number of the transistors is, the smaller leakage current the transistors generate under a normal operation. Therefore, the optimum transistor number may be determined based on circuit simulation results.

FIG. 2B illustrates an implementation of the ESD protection apparatus 200 that is supplementary to the implementation illustrated in FIG. 2A. In FIG. 2B, N-type transistors N1 to Ni are used to form a transistor string which is connected in series between the transistor P1 and power rail line BL. The transistor P1 is connected in series between the transistor N1 and the pad PAD. Upon an ESD occurrence on the pad PAD, an ESD current flowing out of the pad PAD flows from the drain of the transistor P1 to the bulk of the transistor P1 through the forward conduction of the parasitic diode and flows to the power rail line BL through channels of the series-connected transistors N1 to Ni and thereby quickly triggers the parasitic SCR in the transistors N1 to Ni and transistor P1, thus effectively discharging the ESD current.

Likewise, the number of the transistors N1 to Ni may be selected according to the actual circuit which the transistors belong to. In brief, the leakage current generated through the transistors N1 to N1 and P1 must be lower than a tolerated range at a highest possible voltage designed for the pad PAD. The minimal possible number of the transistors N1 to Ni may be one. The less the number of the transistors is, the less voltage drop the transistors cause when the ESD current is conducted. On the other hand, the more the number of the transistors is, the smaller leakage current the transistors generate under a normal operation. Therefore, the optimum transistor number may be determined based on circuit simulation results.

Figure 2C:
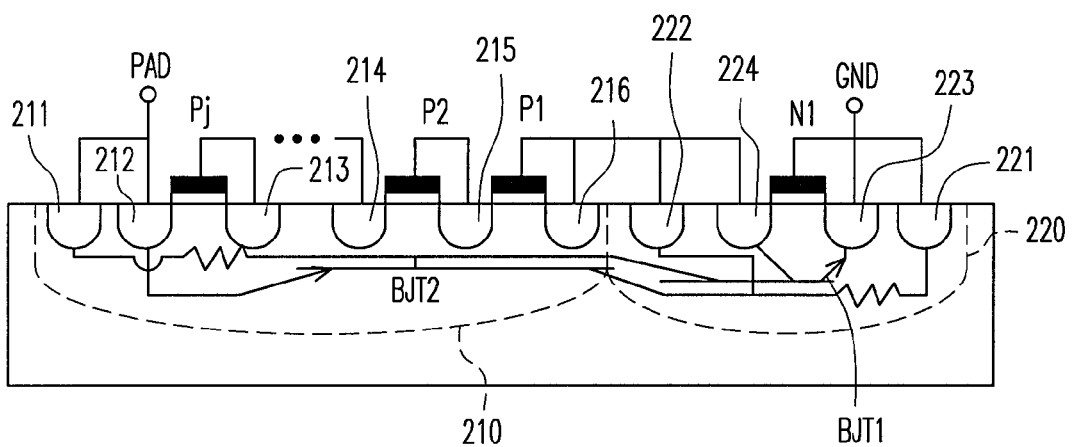
FIG. 2C is a cross sectional view of the structure of the ESD protection apparatus of FIG. 2A.

Referring to FIG. 2A and FIG. 2C, FIG. 2C is a cross sectional view of the structure of the ESD protection apparatus 200 of FIG. 2A. In FIG. 2C, the transistors P1 to Pj are constructed on an N-well 210, and the transistor N1 is constructed on a P-well 220. The N-well 210 is provided with multiple P-type heavily doped regions (P+) 212 to 216 serving as the sources and drains of the transistors P1 to Pj. In addition, the N-well 210 is provided with an N-type heavily doped region (N+) 211 serving as the common bulk of the transistors P1 to Pj. The P-well 220 is provided with multiple N-type heavily doped regions (N+) 223 to 224 serving as the sources and drains of the transistors N1 to Ni. The P-well 220 is further provided with P-type heavily doped regions (P+) 221 and 222. The heavily doped region 221 serves as the bulk of the transistor N1, and the heavily doped region 222 serves as the bulk of the transistor N1 for connecting to the drain of the transistor P1 (constructed by the P-type heavily doped region 216).

Notably, in the ESD protection apparatus 200 of FIG. 2C, the N-type heavily doped region 211, N-well 210, P-well 220 and N-type doped region 223 form a parasitic transistor BJT1, while the P-type heavily doped region 212, N-well 210, P-well 220 and P-type heavily doped region 221 form a parasitic transistor BJT2. The transistor BJT1 and the transistor BJT2 are coupled to each other to form a SCR. This SCR formed by the transistor BJT1 and the transistor BJT2 can be quickly triggered to provide a discharge path for the ESD current upon ESD occurrence on the pad PAD.

Figure 3A:
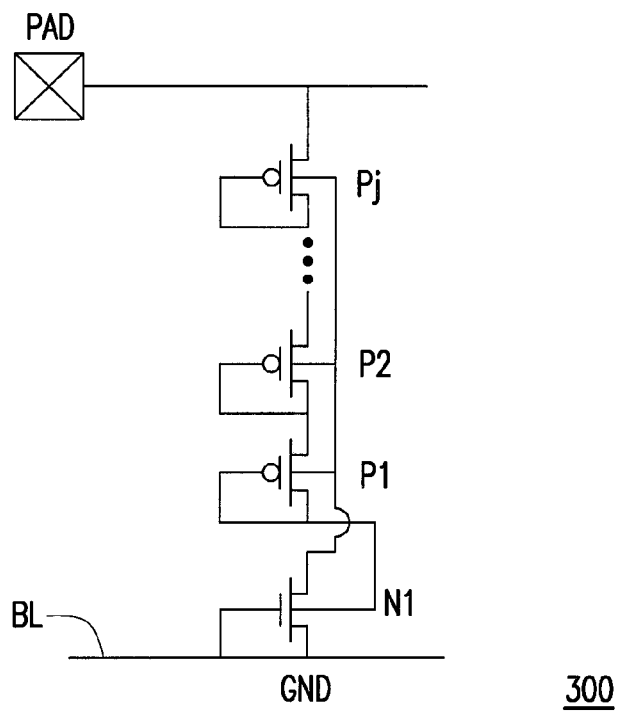
FIG. 3A and FIG. 3B illustrate different implementations of an ESD protection apparatus according to another embodiment of the present invention, respectively.
Figure 3B:
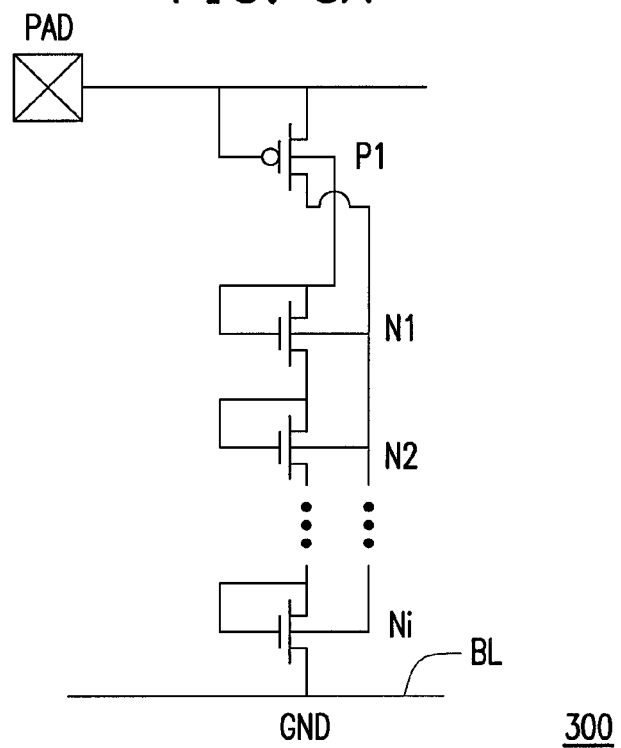

FIG. 3A and FIG. 3B illustrate different implementations of an ESD protection apparatus 300 according to another embodiment of the present invention, respectively. In FIG. 3A, the ESD protection apparatus 300 includes a transistor N1 and transistors P1 to Pj. A control terminal (gate) and a first terminal (source) of the transistor N1 are commonly coupled to the power rail line BL. The power rail line BL of the present embodiment is used to supply a ground voltage GND. In addition, the transistors P1 to Pj are connected in series between the transistor N1 and the pad PAD. The transistor P1 is coupled to a second terminal (drain) of the transistor N1 through a bulk of the transistor P1. Further, a control terminal (gate) and a first terminal (drain) of each transistor P1 to Pj are coupled to each other, the bulks of the transistors P1 to Pj are coupled to each other, and a second terminal (source) of the transistor P1 is coupled to the pad PAD.

Notably, upon an ESD occurrence on the pad PAD, an ESD current flowing out of the pad PAD flows to the bulk of the transistor N1 through channels of the transistors P1 to Pj and thereby quickly triggers the parasitic SCR in the transistors P1 to Pj and transistor N1, thus effectively discharging the ESD current.

Correspondingly, FIG. 3B illustrates an implementation of the ESD protection apparatus 300 that is supplementary to the implementation illustrated in FIG. 3A. In FIG. 3B, N-type transistors N1 to Ni are used to form a transistor string which is connected in series between the transistor P1 and power rail line BL. The transistor P1 is connected in series between the transistor N1 and the pad PAD. Upon an ESD occurrence on the pad PAD, an ESD current flowing out of the pad PAD flows from the drain of the transistor P1 to the bulk of the transistor P1 through a forward conduction of the parasitic diode and flows to the power rail line BL through channels of the series-connected transistors N1 to Ni and thereby quickly triggers the parasitic SCR in the transistors N1 to Ni and transistor P1, thus effectively discharging the ESD current.

The number of both the transistors P1 to Pj and transistors N1 to Ni illustrated in FIG. 3A and FIG. 3B can be adjusted. The number of the transistors P1 to Pj and transistors N1 to Ni can be adjusted in the same manner as described with respect to the previous embodiments, which is therefore not repeated herein.

Figure 3C:
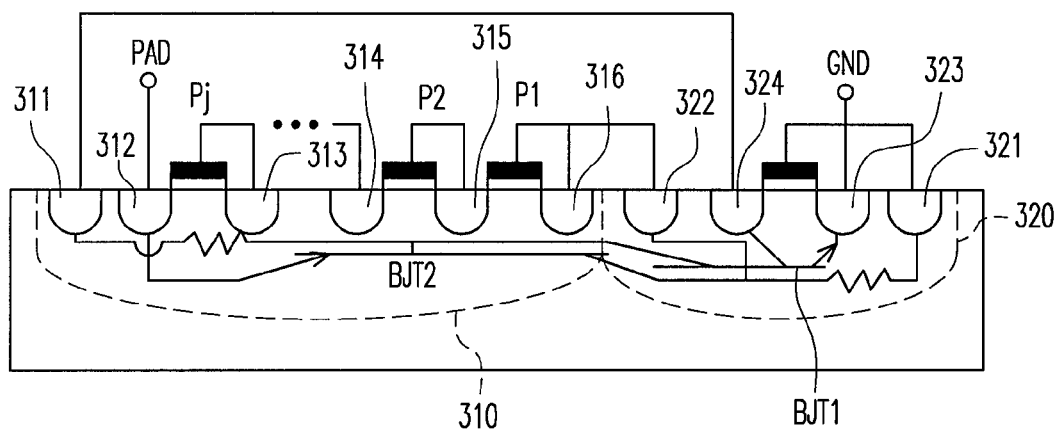
FIG. 3C is a cross sectional view of the structure of the ESD protection apparatus of FIG. 3A.

Referring to FIG. 3A and FIG. 3C, FIG. 3C is a cross sectional view of the structure of the ESD protection apparatus 300 of FIG. 3A. In FIG. 3C, the transistors P1 to Pj are constructed on an N-well 310, and the transistor N1 is constructed on a P-well 320. The N-well 310 is provided with multiple P-type heavily doped regions (P+) 312 to 316 serving as the sources and drains of the transistors P1 to Pj. In addition, the N-well 310 is provided with an N-type heavily doped region (N+) 311 serving as the common bulk of the transistors P1 to Pj. The P-well 320 is provided with multiple N-type heavily doped regions (N+) 323 to 324 serving as the sources and drains of the transistors N1. The P-well 320 is further provided with P-type heavily doped regions (P+) 321 and 322. The heavily doped regions 321 and 322 serve as the bulk of the transistor N1, and the heavily doped region 322 is connected to the drain of the transistor P1 that is constructed by the P-type heavily doped region 316.

Notably, in the ESD protection apparatus 300 of FIG. 3C, the N-type heavily doped region 311, N-well 310, P-well 320 and N-type doped region 323 form a parasitic transistor BJT1, while the P-type heavily doped region 312, N-well 310, P-well 320 and P-type heavily doped region 321 form a parasitic transistor BJT2. The transistor BJT1 and the transistor BJT2 are coupled to each other to form a SCR. This SCR formed by the transistor BJT1 and the transistor BJT2 can be quickly triggered to provide a discharge path for the ESD current upon ESD occurrence on the pad PAD.

Figure 4A:
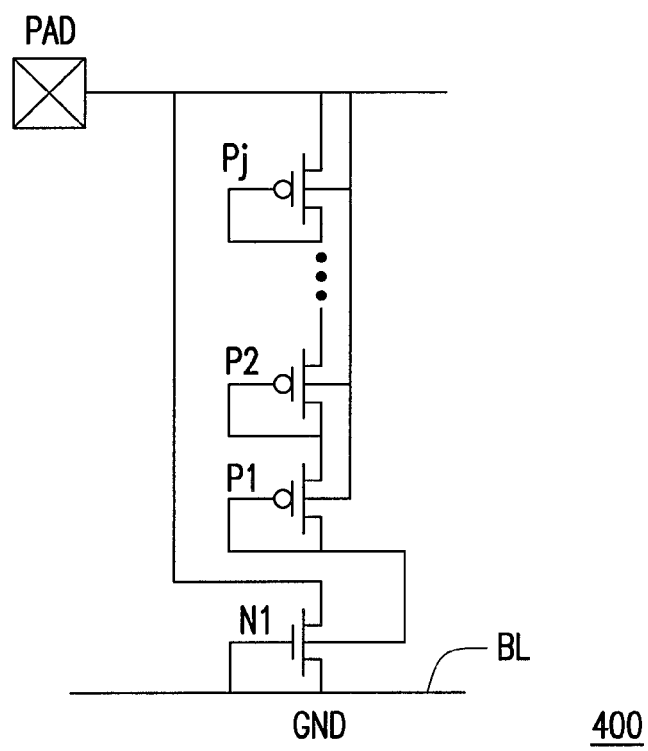
FIG. 4A and FIG. 4B illustrate different implementations of an ESD protection apparatus according to another embodiment of the present invention, respectively.
Figure 4B:
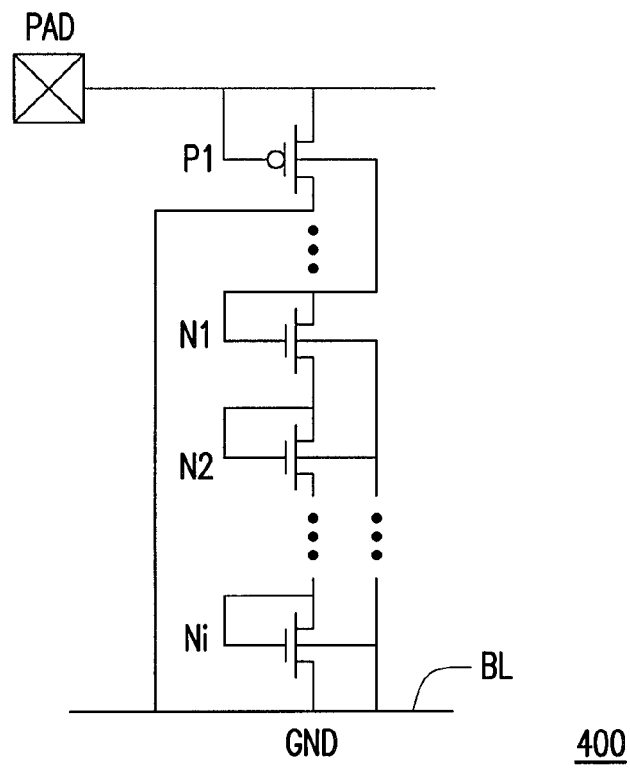

FIG. 4A and FIG. 4B illustrate different implementations of an ESD protection apparatus 400 according to another embodiment of the present invention, respectively. In FIG. 4A, the ESD protection apparatus 400 includes a transistor N1 and transistors P1 to Pj. A control terminal (gate) and a first terminal and a second terminal (source and drain) of the transistor N1 are coupled between the power rail line BL and the pad PAD. The power rail line BL of the present embodiment is used to supply a ground voltage GND. In addition, the transistors P1 to Pj are connected in series between the transistor N1 and the pad PAD. The transistor P1 is coupled to a bulk of the transistor N1 through a gate of the transistor P1. Further, a gate and a drain of each transistor P1 to Pj are coupled to each other, and the bulks of the transistors P1 to Pj are coupled to each other and to the pad PAD.

Notably, upon an ESD occurrence on the pad PAD, an ESD current flowing out of the pad PAD flows to the bulk of the transistor N1 through channels of the transistors P1 to Pj, and thereby quickly triggers the parasitic SCR in the transistors P1 to Pj and transistor N1, thus effectively discharging the ESD current.

Correspondingly, FIG. 4B illustrates an implementation of the ESD protection apparatus 400 that is supplementary to the implementation illustrated in FIG. 4A. In FIG. 4B, N-type transistors N1 to Ni are used to form a transistor string which is connected in series between the transistor P1 and power rail line BL. The transistor P1 is connected in series between the transistor N1 and the pad PAD. Upon an ESD occurrence on the pad PAD, an ESD current flowing out of the pad PAD may flow from the drain of the transistor P1 to the bulk of the transistor P1 through a forward conduction of the parasitic diode and flow to the power rail line BL through channels of the series-connected transistors N1 to Ni and thereby quickly trigger the parasitic SCR in the transistors N1 to Ni and transistor P1, thus effectively discharging the ESD current.

As in the embodiments described above, the number of both the transistors P1 to Pj and transistors N1 to Ni illustrated in FIG. 4A and FIG. 4B can be adjusted. The number of the transistors P1 to Pj and transistors N1 to Ni can be adjusted in the same manner as described with respect to the previous embodiments, which is therefore not repeated herein.

Figure 4C:
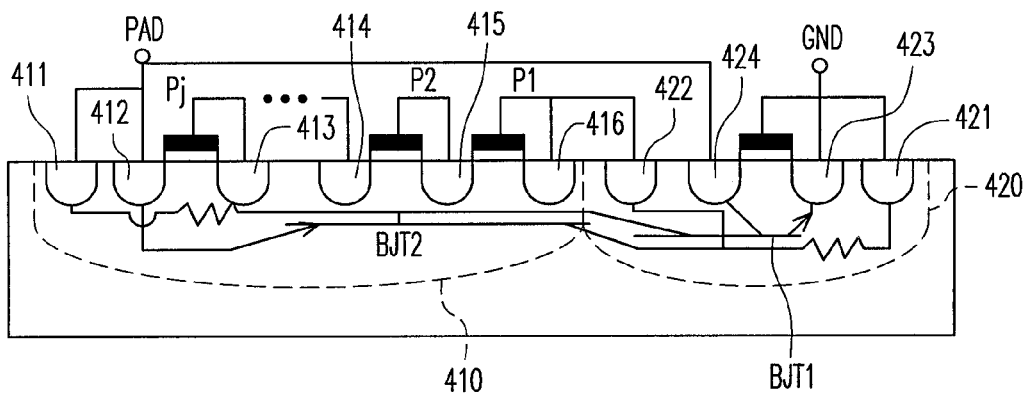
FIG. 4C is a cross sectional view of the structure of the ESD protection apparatus of FIG. 4A.

Referring to FIG. 4A and FIG. 4C, FIG. 4C is a cross sectional view of the structure of ESD protection apparatus 400 of FIG. 4A. In FIG. 4C, the transistors P1 to Pj are constructed on an N-well 410, and the transistor N1 is constructed on a P-well 420. The N-well 410 is provided with multiple P-type heavily doped regions (P+) 412 to 416 serving as the sources and drains of the transistors P1 to Pj. In addition, the N-well 410 is provided with an N-type heavily doped region (N+) 411 serving as the common bulk of the transistors P1 to Pj. The heavily doped regions 411 and 412 are commonly coupled to the pad PAD. The P-well 420 is provided with multiple N-type heavily doped regions (N+) 423 to 424 serving as the sources and drains of the transistors N1. In addition, the P-well 420 is further provided with P-type heavily doped regions (P+) 421 and 422. The heavily doped regions 421 and 422 serve as the bulk of the transistor N1, and the heavily doped region 422 is connected to the drain of the transistor P1 that is constructed by the P-type heavily doped region 416.

Notably, in the ESD protection apparatus 400 of FIG. 4C, the N-type heavily doped region 411, N-well 410, P-well 420 and N-type doped region 423 form a parasitic transistor BJT1, while the P-type heavily doped region 412, N-well 410, P-well 420 and P-type heavily doped region 421 form a parasitic transistor BJT2. The transistor BJT1 and the transistor BJT2 are coupled to each other to form a SCR. This SCR formed by the transistor BJT1 and the transistor BJT2 can be quickly triggered to provide a discharge path for the ESD current upon ESD occurrence on the pad PAD.

In summary, the present invention utilizes one or more P-type transistors or N-type transistors connected in series in a particular manner to construct the ESD protection apparatus, such that the ESD current produced on the pad due to an ESD event can flow to a bulk of the N-type (or P-type) transistor through channels of the P-type (or N-type) transistor string and thereby quickly trigger a parasitic SCR in the ESD protection apparatus, thus effectively discharging the ESD current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection apparatus comprising:
    at least one first transistor comprising a control terminal, a first terminal, a second terminal, and a bulk, the control terminal and the second terminal of the first transistor being coupled to each other, the first terminal of the first transistor and a pad being coupled to each other; and
    at least one second transistor comprising a control terminal, a first terminal, and a second terminal, the first terminal of the second transistor being coupled to the bulk of the first transistor, the control terminal of the second transistor being coupled to the first terminal of the second transistor, the bulk of the second transistor being directly coupled to the control terminal and the second terminal of the first transistor, and the second terminal of the second transistor being coupled to a power rail line.

2. The electrostatic protection apparatus according to claim 1, wherein the power rail line is adapted to provide a ground voltage.

3. The electrostatic protection apparatus according to claim 2, wherein the first transistor is a P-type transistor and the second transistor is an N-type transistor.

4. An electrostatic discharge protection apparatus comprising:
    a first transistor comprising a control terminal, a first terminal, a second terminal, and a bulk, the control terminal and the second terminal of the first transistor being commonly coupled one of a pad and a power rail line, the bulk and the first terminal of the first transistor being coupled to each other; and
    at least one second transistor comprising a control terminal, a first terminal, a second terminal, and a bulk, the control terminal and the second terminal of the second transistor being directly coupled to the bulk and the first terminal of the first transistor, the bulk and the first terminal of the second transistor being coupled to the other of the pad and the power rail line.

5. The electrostatic protection apparatus according to claim 4, wherein the power rail line is adapted to provide a ground voltage, and when the first transistor is coupled to the pad, the first transistor is a P-type transistor and the second transistor is an N-type transistor.

6. The electrostatic protection apparatus according to claim 4, wherein the power rail line is adapted to provide a ground voltage, and when the first transistor is coupled to the ground voltage, the first transistor is an N-type transistor, and the second transistor is a P-type transistor.

7. An electrostatic discharge protection apparatus comprising:
    a first transistor comprising a control terminal, a first terminal, a second terminal, and a bulk, the control terminal and the first terminal of the first transistor being commonly coupled one of a pad and a power rail line; and
    at least one second transistor comprising a control terminal, a first terminal, a second terminal, and a bulk, the control terminal of the second transistor being directly coupled to the bulk of the first transistor and the first terminal of the second transistor, the bulk of the second transistor being coupled to the second terminal of the first transistor, and the second terminal of the second transistor being coupled to the other of the pad and the power rail line.

8. The electrostatic protection apparatus according to claim 7, wherein the power rail line is adapted to provide a ground voltage, and when the first transistor coupled to the pad, the first transistor is a P-type transistor and the second transistor is an N-type transistor.

9. The electrostatic protection apparatus according to claim 7, wherein the power rail line is adapted to provide a ground voltage, and when the first transistor is coupled to the ground voltage, the first transistor is an N-type transistor, and the second transistor is a P-type transistor.

10. An electrostatic discharge protection apparatus comprising:
   a first transistor comprising a control terminal, a first terminal, a second terminal, and a bulk, the first terminal and the second terminal of the first transistor being coupled to a pad and a power rail line respectively, and the control terminal of the first transistor being coupled to one of the pad and the power rail line; and
   at least one second transistor comprising a control terminal, a first terminal, a second terminal, and a bulk, the control terminal of the second transistor being coupled to the second terminal of the second transistor, and the control terminal and the second terminal of the second transistor being directly coupled to the bulk of the first transistor, the first terminal and the bulk of the second transistor being commonly coupled to the other of the pad and the power rail line.

11. The electrostatic protection apparatus according to claim 10, wherein the power rail line is adapted to provide a ground voltage, and when the first transistor is coupled to the pad, the first transistor is a P-type transistor and the second transistor is an N-type transistor.

12. The electrostatic protection apparatus according to claim 10, wherein the power rail line is adapted to provide a ground voltage, and when the first transistor is coupled to the ground voltage, the first transistor is an N-type transistor, and the second transistor is a P-type transistor.

* * * * *